United States Patent
Zhang

(10) Patent No.: US 9,171,977 B2
(45) Date of Patent: Oct. 27, 2015

(54) OPTICALLY ASSIST-TRIGGERED WIDE BANDGAP THYRISTORS HAVING POSITIVE TEMPERATURE COEFFICIENTS

(75) Inventor: Qingchun Zhang, Cary, NC (US)

(73) Assignee: Cree, Inc., Durham, NC (US)

( * ) Notice: Subject to any disclaimer, the term of this patent is extended or adjusted under 35 U.S.C. 154(b) by 308 days.

(21) Appl. No.: 13/461,049

(22) Filed: May 1, 2012

(65) Prior Publication Data

US 2012/0319133 A1 Dec. 20, 2012

Related U.S. Application Data

(60) Provisional application No. 61/498,049, filed on Jun. 17, 2011.

(51) Int. Cl.
| | |
|---|---|
| H01L 31/111 | (2006.01) |
| H01L 31/0312 | (2006.01) |
| H01L 27/144 | (2006.01) |
| H01L 29/74 | (2006.01) |
| H01L 29/16 | (2006.01) |

(52) U.S. Cl.
CPC ........ H01L 31/0312 (2013.01); H01L 27/1443 (2013.01); H01L 29/1608 (2013.01); H01L 29/7428 (2013.01); H01L 31/1113 (2013.01)

(58) Field of Classification Search
CPC ............ H01L 31/0312; H01L 31/1113; H01L 31/03125
See application file for complete search history.

(56) References Cited

U.S. PATENT DOCUMENTS

| | | |
|---|---|---|
| 4,599,633 A | 7/1986 | Thire et al. |
| 4,841,350 A | 6/1989 | Nishizawa |
| 6,703,642 B1 * | 3/2004 | Shah ............................... 257/77 |
| 7,851,274 B1 * | 12/2010 | Shah ............................. 438/139 |
| 2002/0134992 A1 | 9/2002 | Shah |
| 2004/0206976 A1 * | 10/2004 | Agarwal et al. ............... 257/153 |

(Continued)

FOREIGN PATENT DOCUMENTS

| | | |
|---|---|---|
| JP | 64-071181 | 3/1989 |
| JP | 03-046334 | 2/1991 |

(Continued)

OTHER PUBLICATIONS

Notification of Transmittal of the International Search Report and the Written Opinion of the International Searching Authority, or the Declaration issued for PCT/US2012/037187, Mailing Date Aug. 10, 2012, 16 pages.

(Continued)

*Primary Examiner* — Hrayr A Sayadian
(74) *Attorney, Agent, or Firm* — Myers Bigel Sibley & Sajovec, P.A.

(57) ABSTRACT

A thyristor includes a first conductivity type semiconductor layer, a first conductivity type carrier injection layer on the semiconductor layer, a second conductivity type drift layer on the carrier injection layer, a first conductivity type base layer on the drift layer, and a second conductivity type anode region on the base layer. The thickness and doping concentration of the carrier injection layer are selected to reduce minority carrier injection by the carrier injection layer in response to an increase in operating temperature of the thyristor. A crossover current density at which the thyristor shifts from a negative temperature coefficient of forward voltage to a positive temperature coefficient of forward voltage is thereby reduced.

19 Claims, 6 Drawing Sheets

(56) References Cited

U.S. PATENT DOCUMENTS

| | | | |
|---|---|---|---|
| 2007/0117336 A1* | 5/2007 | Sumakeris et al. | 438/369 |
| 2007/0221949 A1* | 9/2007 | Palmer et al. | 257/133 |
| 2009/0045413 A1* | 2/2009 | Ishii et al. | 257/77 |
| 2010/0283529 A1 | 11/2010 | Zhang et al. | |

FOREIGN PATENT DOCUMENTS

| | | |
|---|---|---|
| JP | 2005503024 (A) | 1/2005 |
| WO | WO 03/023870 A1 | 3/2003 |

OTHER PUBLICATIONS

Notification Concerning Transmittal of International Preliminary Report on Patentability, PCT/US2012/037187, Jan. 3, 2014, 11 pages.

Extended European Search Report corresponding to European Application No. 12800540.2, dated Jun. 2, 2015 (10 pages).

Office Action (Notification of Reasons for Rejection) corresponding to Japanese Patent Application No. 2014-515824, dated Apr. 1, 2015 (10 pages, including translation).

Ogunniyi et al. "The Benefits and Current Progress of SiC SCTOs for Pulsed Power Applications" *Solid State Electronics*, vol. 54, No. 10, pp. 1232-1237, Jun. 29, 2010.

Palmour et al. "SiC Power Devices for Smart Grid Systems" *2010 International Power Electronics Conference*: IPEC-Sapporo 2010—[ECCE Asia]; Sapporo, Japan, IEEE, Piscataway, NJ, Jun. 21 2010, pp. 1006-1013, XP031727517, ISBN: 978-1-4244-5394-8.

Zhang et al. "Design and Characterization of High-Voltage 4H-SiC p-IGBTs" IEEE Transactions on Electron Devices, vol. 55, No. 8, pp. 1912-1919, Aug. 2008.

\* cited by examiner

OPTICALLY ASSIST-TRIGGERED WIDE BANDGAP THYRISTORS HAVING POSITIVE TEMPERATURE COEFFICIENTS

CROSS REFERENCE TO RELATED APPLICATION AND CLAIM OF PRIORITY

The present application claims the benefit of and priority to U.S. Provisional Patent Application No. 61/498,049, filed Jun. 17, 2011, entitled "Optically Assist-Triggered Wide Bandgap Thyristors," the disclosure of which is hereby incorporated herein by reference in its entirety.

STATEMENT OF U.S. GOVERNMENT INTEREST

This invention was made with Government support under Contract No. DAAD19-01-C-0067 awarded by The United States Army Research Laboratories. The Government has certain rights in the invention.

FIELD

This inventive concepts disclosed herein relate to microelectronic devices and circuits, and more particularly to devices and circuits including power switching devices, such as optically triggered thyristors.

BACKGROUND

A thyristor is a four-layer latching switching device having an anode and a cathode for current flow and a gate for switching the device from a blocking state to a conducting state, and vice versa. A control signal applied to the gate causes the device to "latch" into a conductive state in which current can flow freely between the anode and cathode of the device. The device remains in the conductive state even after the control signal is removed. A second control signal, opposite in polarity to the first control signal, switches the device back into the "off" or blocking state. The design of optically triggered wide bandgap thyristors is generally known in the art. For example, U.S. Pat. No. 6,770,911 entitled "Large Area Silicon Carbide Devices," assigned to the assignee of the present application, describes the design and manufacture of optically triggered silicon carbide thyristors. U.S. Pat. No. 6,770,911 is hereby incorporated herein by reference as if set forth in its entirety.

Other silicon carbide thyristors are described, for example, in U.S. Pat. No. 5,539,217, the disclosure of which is incorporated herein by reference as if set forth fully. The thyristors described in the '217 patent are three terminal devices having a gate and one of an anode or a cathode on a first side of the device and the other of the anode and the cathode on the opposite side of the device. Such silicon carbide thyristors may exhibit improved power handling capabilities over similar silicon thyristors.

Light activated silicon thyristors have been utilized in high power applications. For example, optically triggered parallel lateral thyristors are described in U.S. Pat. No. 4,779,126, the disclosure of which is incorporated herein by reference as if set forth fully. Light-activated (i.e., optically triggered) thyristors having an integrated light source and a silicon carbide active layer have been described in U.S. Pat. No. 5,663,580, the disclosure of which is incorporated herein by reference as if set forth fully. Other optically triggered wide bandgap devices are illustrated in U.S. Publication No. 2006/0261876, the disclosure of which is incorporated herein by reference as if set forth fully.

SUMMARY

A thyristor according to some embodiments includes a semiconductor layer having a first conductivity type and a first doping concentration, a carrier injection layer on the semiconductor layer, the carrier injection layer having the first conductivity type and a second doping concentration that is lower than the first doping concentration, a drift layer on the carrier injection layer, the drift layer having the second conductivity type, a base layer having the first conductivity type on the drift layer, and an anode region having the second conductivity type on the base layer.

A thickness of the carrier injection layer and the second doping concentration are selected to reduce minority carrier injection by the carrier injection layer in response to an increase in operating temperature of the thyristor.

A cross-over current density at which the thyristor shifts from a negative temperature coefficient of forward voltage to a positive temperature coefficient of forward voltage is less than 100 A/cm$^2$. In some embodiments, the cross-over current density may be less than 75 A/cm$^2$, and in some embodiments the cross-over current density may be between 50 A/cm$^2$ and 75 A/cm$^2$.

The thyristor may further include a buffer layer having the second conductivity type between the carrier injection layer and the drift layer. The carrier injection layer and the buffer layer may form a p-n junction. The buffer layer has a third doping concentration that is higher than a doping concentration of the drift layer.

The base layer may include a main base layer and an assistant base layer that is isolated from the main base layer. The thyristor may further include an assistant anode region on the assistant base layer and having the second conductivity type, and a conductive interconnect between the assistant anode region and the main base layer.

The assistant base layer may define an optically triggered driver thyristor.

The semiconductor layer, the carrier injection layer, the drift layer, the base layer and the anode region may include silicon carbide.

Some embodiments provide a silicon carbide based thyristor having a positive temperature coefficient of forward voltage at a forward current density less than 100 A/cm$^2$.

A cross-over current density at which the silicon carbide based thyristor may shift from a negative temperature coefficient of forward voltage to a positive temperature coefficient of forward voltage is less than 100 A/cm$^2$. In some embodiments, the cross-over current density may be less than 75 A/cm$^2$, and in some embodiments the cross-over current density may be between 50 A/cm$^2$ and 75 A/cm$^2$.

An optically triggered thyristor according to some embodiments includes a primary thyristor including a base layer and a plurality of optically triggered assistant thyristors defined in the base layer and configured to supply current to the base layer of the primary thyristor in response to an optical signal. The optically triggered thyristor may be configured to sustain at least 10 kV in reverse blocking mode and has a positive temperature coefficient of forward voltage at a forward current density less than 100 A/cm$^2$.

An optically triggered silicon carbide thyristor according to some embodiments includes a silicon carbide layer having a first conductivity type and a first doping concentration, a first silicon carbide buffer layer on the semiconductor layer, the first silicon carbide buffer layer having the first conductivity type and a second doping concentration that is lower than the first doping concentration, a second silicon carbide buffer layer on the first buffer layer, the second silicon carbide buffer layer having a second conductivity type opposite the first conductivity type and forming a p-n junction with the first silicon carbide buffer layer, a silicon carbide drift layer on the second buffer layer, the silicon carbide drift layer having the second conductivity type, and a silicon carbide base layer having the first conductivity type on the silicon carbide drift layer. The silicon carbide base layer is divided into a main base layer and at least one assistant base layer that is isolated from the main base layer. A first silicon carbide anode region having the second conductivity type is on the main base layer, a second silicon carbide anode region having the second conductivity type is on the assistant base layer, and a conductive interconnect conductively connects the second anode region and the main base layer. A thickness of the first silicon carbide buffer layer and the second doping concentration are selected to reduce minority carrier injection across the p-n junction with the second silicon carbide buffer layer in response to an increase in operating temperature of the optically triggered thyristor.

It is noted that aspects of the invention described with respect to one embodiment may be incorporated in a different embodiments although not specifically described relative thereto. That is, all embodiments and/or features of any embodiments can be combined in any way and/or combination. These and other objects and/or aspects of the present invention are explained in detail in the specification set forth below.

Other systems, methods, and/or computer program products according to embodiments of the invention will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Figure 1:
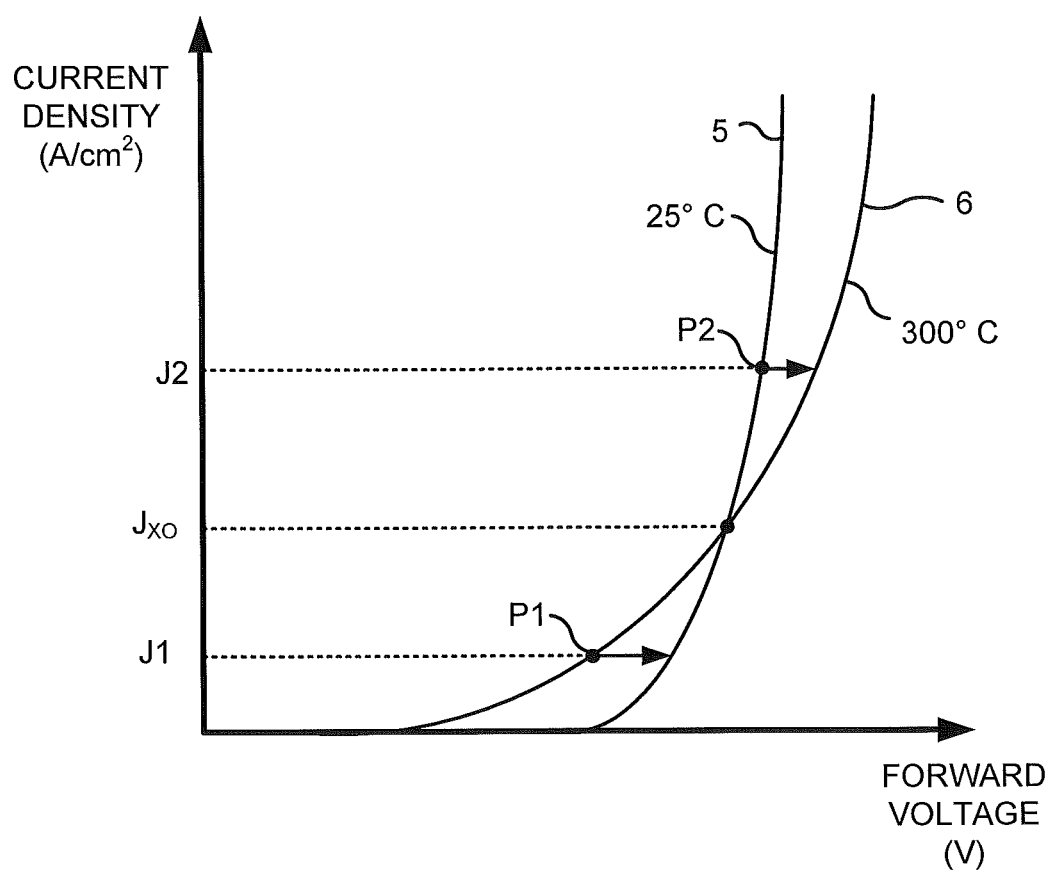
FIG. 1 is a graph of current density versus forward voltage of a hypothetical device.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this disclosure and the relevant art and will not be interpreted in an idealized or overly formal sense unless expressly so defined herein.

As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN.

Thyristors according to embodiments of the present invention may be formed of silicon carbide having a polytype of 3C, 2H, 4H, 6H, and 15R, or from any of the various Group III-nitride materials useful for fabricating electronic devices. In the illustrated embodiments, the n+ and n− regions, as well as the p+ and p− regions, are designated "+" and "−" to symbolize different doping concentration levels respectively of the same conductivity type material in a manner well understood to those of ordinary skill in this art. As used herein, the "+" and "−" designations do not necessarily imply that a material is degenerate on one hand or semi-insulating on the other. The p-type silicon carbide may be doped, for example, with aluminum or boron and the n-type silicon carbide may be doped, for example, with nitrogen or phosphorous. P-type nitrides may be doped, for example, with magnesium, while n-type nitrides may be doped, for example, with silicon.

In an optically triggered thyristor, light from a light source, such as an LED or laser diode device is impinged directly on the base region of the thyristor to generate electron-hole pairs. In a typical optically triggered silicon carbide thyristor, a light source having a high power level is required in order to switch the thyristor to a conducting state (i.e., turn the thyristor on). The turn on time, which relates to the rate of change of current as a function of time (di/dt), in such devices is typically poor. Moreover, to form a thyristor having a high blocking voltage, a thick drift layer is required, which may reduce the current gain of the bottom transistor portion of the thyristor. As a result, the thyristor needs an even higher optical power level to turn on.

Conventional SiC thyristors exhibit a negative temperature coefficient of the forward voltage drop due to the enhanced conductivity modulation in the drift layer at high temperatures. For power system applications, it is preferred for the devices to have a positive temperature coefficient for ease of paralleling the devices.

FIG. 1 illustrates the effect of positive versus negative temperature coefficients of forward voltage for power devices. In particular, FIG. 1 illustrates a graph of current density versus forward voltage for a hypothetical power device operating at 25 degrees C. (curve 5) and 300 degrees C. (curve 6). For the current-voltage characteristics shown, the device has a cross-over point Jxo at which the temperature, coefficient of forward voltage switches from negative to positive, as explained below.

Assume the device is heated to the high temperature (300 degrees C.) and operated at a current density of J1<Jxo at point P1. If this device is cooled to the low temperature, the forward voltage (Vf) of the device will increase while maintaining the same current density. Thus, this device has a negative temperature coefficient of forward voltage (decreasing temperature increases Vf). This is the case for all current densities below the cross-over point Jxo.

Now consider the device operating at a current density J2>Jxo at the low temperature (25 degrees C.; this may occur, for example, if the current in a cool-running diode spikes to J2). Due to the high current density, the temperature of the device may increase from the low temperature to the high temperature. For a given current density J2, the forward voltage of the device will increase in response to an increased temperature. Thus, the temperature coefficient of forward voltage is positive for current densities above the cross-over current density Jxo.

Devices that have positive temperature coefficients of forward voltage can be successfully operated in parallel, because the positive temperature coefficient of forward voltage provides a stabilizing effect on the devices. For example, if one of the devices heats to a higher temperature than the other devices, the forward voltage of the hotter device will increase, which can reduce current through the device, causing it to cool.

In contrast, devices that have negative temperature coefficients of forward voltage can experience so-called "thermal runaway" when operated in parallel. For example, if one of the devices heats to a higher temperature than the other devices, the forward voltage of the hotter device will decrease, which can increase current through the device, causing it to heat even more and potentially leading to thermal failure.

Figure 2:
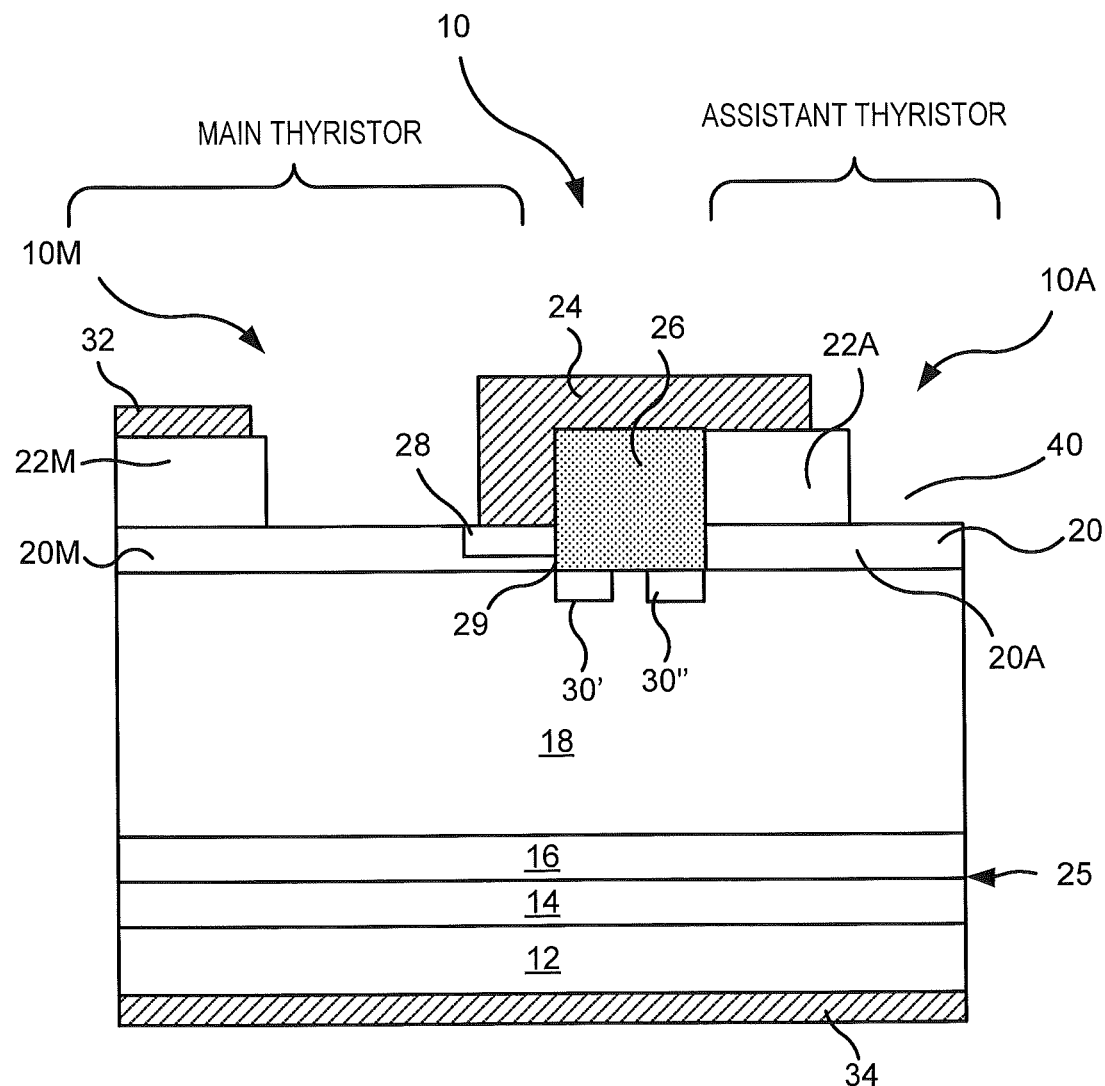
FIG. 2 is a cross sectional illustration of an optically triggered thyristor in accordance with some embodiments.
Figure 3A:
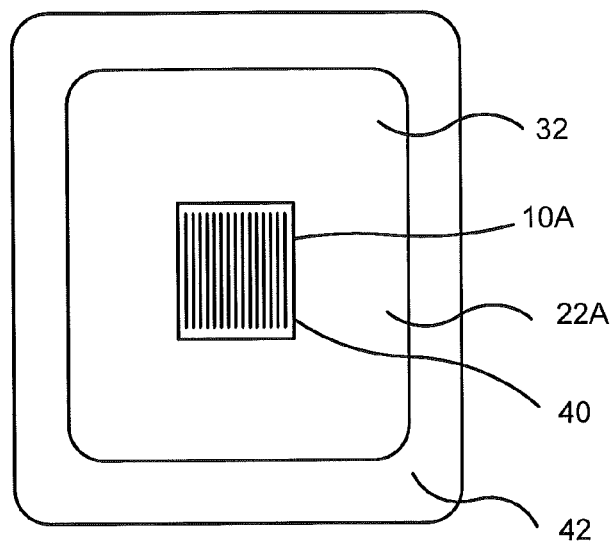
FIG. 3A is a schematic top view of an optically triggered assistant thyristor in accordance with some embodiments.

FIG. 2 is a cross sectional illustration of an optically triggered thyristor 10 in accordance with some embodiments. The silicon carbide thyristor 10 includes a main thyristor 10M and one or more optically triggered assistant thyristors 10A. FIG. 3A is a schematic top view of an optically triggered assistant thyristor 10A in accordance with some embodiments, and FIG. 3B is a schematic top view of a thyristor 10 including a main thyristor 10M and a plurality of optically triggered assistant thyristors 10A in accordance with some embodiments.

Figure 3B:
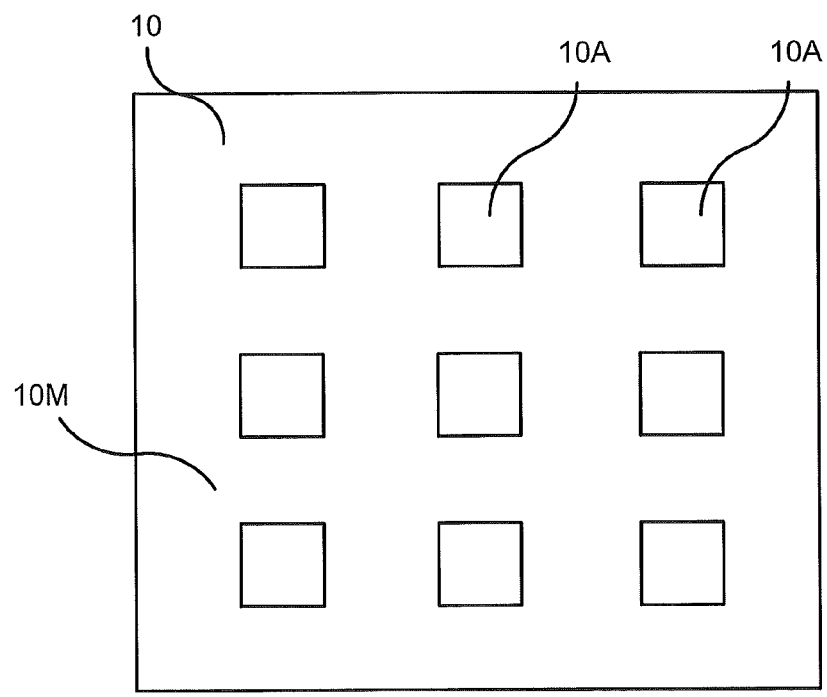
FIG. 3B is a schematic top view of a thyristor including a plurality of optically triggered assistant thyristors in accordance with some embodiments.

Referring to FIGS. 2, 3A and 3B, a thyristor 10 includes a substrate 12 having a first conductivity type and a drift layer 18 having a second conductivity type, opposite the first conductivity type on the substrate 12. A base layer 20 having the first conductivity type is on the drift layer. In some embodiments, the first conductivity type maybe n-type and the second conductivity type may be p-type; in other embodiments, the first conductivity type may be p-type and the second conductivity type may be n-type.

In particular embodiments, the substrate may include an 8° off-axis n+4H—SiC substrate having a thickness of between about 59 microns and 400 microns and a doping concentration between about $5E18$ cm$^{-3}$ and $5E19$ cm$^{-3}$. The drift layer 18 may have a thickness of between about 50 microns and 300 microns and a doping concentration between about $1E13$ cm$^{-3}$ and $5E14$ cm$^{-3}$. In particular embodiments, the drift layer 18 may have a thickness of about 90 microns and a doping concentration less than about $2E14$ cm$^{-3}$.

In some embodiments, the base layer 20 may have a thickness of between about 0.2 and 3 microns and a doping concentration between about $1E17$ cm$^{-3}$ and $2E18$ cm$^{-3}$. In particular embodiments, the base layer 20 may have a thickness of about 2.5 microns and a doping concentration of about $2E17$ cm$^{-3}$. In other embodiments, the base layer 20 may have a doping concentration of about $1E17$ cm$^{-3}$.

A first buffer layer 14 having the first conductivity type and a second buffer layer 16 having the second conductivity type may be provided between the substrate 12 and the drift layer 18. The first and second buffer layers 14, 16 may be doped more heavily than the drift layer. The first and second buffer layers form a p-n junction 25.

In a conventional device, forward operation, minority carriers are injected into the drift layer, which can cause conductivity modulation in the drift layer. In conventional devices, this can lead to an increased temperature coefficient crossover point Jxo.

In some embodiments, the first buffer layer 14 may have a thickness of between about 1 micron and 20 microns and a doping concentration between about $5E17$ $cm^{-3}$ and $5E18$ $cm^{-3}$. In particular embodiments, the first buffer layer 14 may have a thickness of about 3 microns and a doping concentration of about $5E16$ $cm^{-3}$.

The first buffer layer 14 plays two roles in device operation. One is to act as the minority carrier injection layer to the drift layer to modulate the conductivity of the drift layer; another is to be a resistive layer if the thickness and doping are designed properly, such that the resistance of the first buffer layer 14 increases at high temperature, so that minority carrier injection is reduced at higher temperatures. In particular, the first buffer layer 14 may have a thickness and doping such that the resistance of the first buffer layer is sufficient to cause the thyristor 10 to have a positive temperature coefficient of forward voltage.

In some embodiments, the second buffer layer 16 may have a thickness of between about 1 micron and 10 microns and a doping concentration between about $1E16$ $cm^{-3}$ and $1E17$ $cm^{-3}$. In particular embodiments, the second buffer layer 16 may have a thickness of about 2.5 microns and a doping concentration of about $7E16$ $cm^{-3}$. In other embodiments, the second buffer layer 16 may have a thickness of about 4 microns.

The base layer 20 is divided into a first base portion 20M in the main thyristor 10M and a second base portion 20A in the assistant thyristor 10A. The first base portion 20M in the main thyristor 10M and a second base portion 20A in the assistant thyristor 10A are isolated from one another, for example, by a trench 29 that extends through the base layer 20 and into the drift layer 18. The trench 29 may be filled with a dielectric layer 26, that may include silicon dioxide and/or silicon nitride, for example.

One or more doped regions 30', 30" may be provided in the drift layer 18 beneath the trench 29. The doped regions 30', 30" may extend about 0.5 microns into the drift layer, and may be doped at a doping concentration of about $5E18$ $cm^{-3}$. The doped regions 30', 30" provide field protection at the corners of the trench 29 in reverse blocking mode.

The main thyristor 10M includes a first anode mesa 22M on the first base portion 20M of the base layer 20, while the assistant thyristor 10A includes a second anode mesa 22A on the on the second base portion 20A of the base layer 20. The second anode mesa 22A is spaced apart from the first anode mesa 22M on the surface of the base layer 20.

An anode contact 32 is formed on the first anode mesa 22M in the main thyristor 10M. A heavily doped base contact region 28 is provided in the first base portion 20M of the main thyristor 10M. The base contact region 28 may have a doping concentration between about $1E19$ and $5E20$ $cm^{-3}$, and in particular embodiments may have a doping concentration of about $5E19$ $cm^{-3}$.

A conductive interconnect 24 electrically connects the second anode mesa 22A in the assistant thyristor 10A to the base contact region 28. In particular, the conductive interconnect 24, which may include a metal, such as aluminum, or other conductive material, may contact the second anode mesa 22A and extend across the dielectric layer 26 to contact the base contact region 28 in the first base portion 20M of the main thyristor 10M. The conductive interconnect 24 may form ohmic contacts with both the second anode mesa 22A and the base contact region 28.

The assistant thyristor 10A includes an optical gate region 40 in which a portion of the second base portion 20A may be exposed to light from a light source. In some embodiments, the optical gate region may have dimensions of about 2.2 mm×2.2 mm.

An anode contact 32 is formed on the first anode mesa 22M in the main thyristor 10M, and a cathode contact 34 may be formed on the substrate 10. An edge termination region 42 is provided at the periphery of the device, as shown in FIG. 3A. The edge termination region 42 can include one or more floating guard rings, field plates, junction termination extension (JTE) regions or other conventional edge termination structures.

When the assist thyristor 10A is in the "off" state (i.e. no current is flowing between the anode and cathode of the device), no base current is supplied to the main thyristor 10M, and the main thyristor 10M stays in the "off" state.

When sufficiently energetic light is applied to the assistant thyristor 10A, electron-hole pairs are generated in the second base portion 20A of the base layer 20. If sufficient carriers are generated in the second base portion 20A, the energy barrier at the junction between the drift layer 18 and the second base portion 20A will decrease, causing the junction between the second base portion 20A and the drift layer 18 to become forward biased, which turns the assistant thyristor 10A on and permits a flow of electrical current between the second anode mesa 22A and the cathode 34 of the device.

This current is injected into the first base portion 20M of the main thyristor 10M via the conductive interconnect 24 and the base contact region 28, causing the main thyristor 10M to turn on in a similar manner. Current may then flow between the anode 32 and the cathode 34 of the device 10.

As illustrated in FIG. 3, a plurality of assistant thyristors 10A may be provided within a thyristor device 10 according to some embodiments. The pattern of assistant thyristors 10A in the embodiments illustrated in FIG. 3 represent one possible arrangement, although other arrangements are possible.

In some embodiments, the assistant thyristors 10A may be distributed uniformly throughout a main thyristor region 10M. Such an arrangement may allow the thyristor to retain acceptable voltage (dV/dt) characteristics. Moreover, by providing a plurality of optically triggered assistant thyristors, improved turn-on current characteristics can be obtained.

Furthermore, in some embodiments, an optical thyristor with a large blocking voltage can be obtained. In particular, a thyristor having a blocking voltage in excess of 10 kV can be obtained. In further embodiments, a thyristor having a blocking voltage in excess of 12 kV can be obtained, and in still further embodiments, a thyristor having a blocking voltage in excess of 15 kV can be obtained in a device having a chip size in excess of 1 $cm^2$.

Such high blocking voltages may be particularly useful in high power transmission and distribution systems, in which aggregate blocking voltages in excess of 100 kV are required. Using thyristors with blocking voltages in excess of 10 kV can significantly reduce the number of devices needed to provide such high voltage blocking ability.

A ultraviolet (UV) light source may provide light with sufficient energy to cause the assist thyristor 10A to conduct. In some embodiments, the active semiconductor layers of the main thyristor 10M and the assist thyristor 10A include a wide bandgap material such as silicon carbide (SiC), gallium nitride (GaN) or another Group III-nitride material. In order to induce the formation of electron-hole pairs in a wide bandgap material, light, such as ultraviolet (UV) light, with energy in excess of the material bandgap may be directed into the material. For silicon carbide, light having an energy of about 3.25 eV or greater (i.e. a wavelength of about 380 nm or less) may be used. For gallium nitride, which has a smaller bandgap than SiC, light of a correspondingly larger wavelength may be used. UV light may be generated by a UV light emitting diode or laser diode or other suitable light source. UV light emitting diodes are described, for example, in U.S. Pat. No. 6,664,560 entitled "Ultraviolet Light Emitting Diode," which is assigned to the assignee of the present application. U.S. Pat. No. 6,664,560 is hereby incorporated herein by reference as if set forth in its entirety. The UV light source may be formed integral to the thyristor, packaged together with the thyristor 10 as part of a hybrid, or provided as a separate element.

In some embodiments, the polarities of each layer can be opposite for thyristors made on p-type substrates or epitaxial layers.

Figure 4:
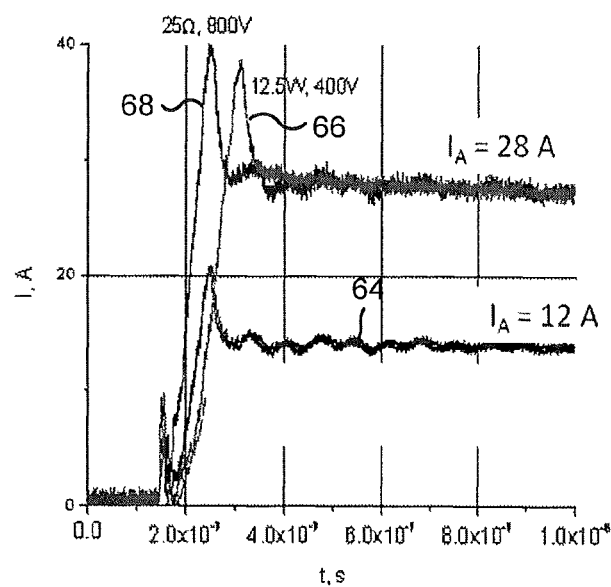
FIG. 4 is a graph illustrating turn-on characteristics of optically triggered assistant thyristors in accordance with some embodiments.

FIG. 4 is a graph illustrating turn-on characteristics of optically triggered assistant thyristors in accordance with some embodiments. In particular, FIG. 4 is a graph of current versus time for optically triggered assistant thyristors in accordance with some embodiments. Curve 64 is a graph of current versus time for an optically triggered assistant thyristor that turns on at an anode current of 12 A. Curves 66 and 68 are graphs of current versus time for an optically triggered assistant thyristor that turn on at an anode current of 28 A. These curves illustrate that an optically triggered assistant thyristor may have a switching time from a blocking state to a conductive state of less than 4E-7 seconds.

Figure 5:
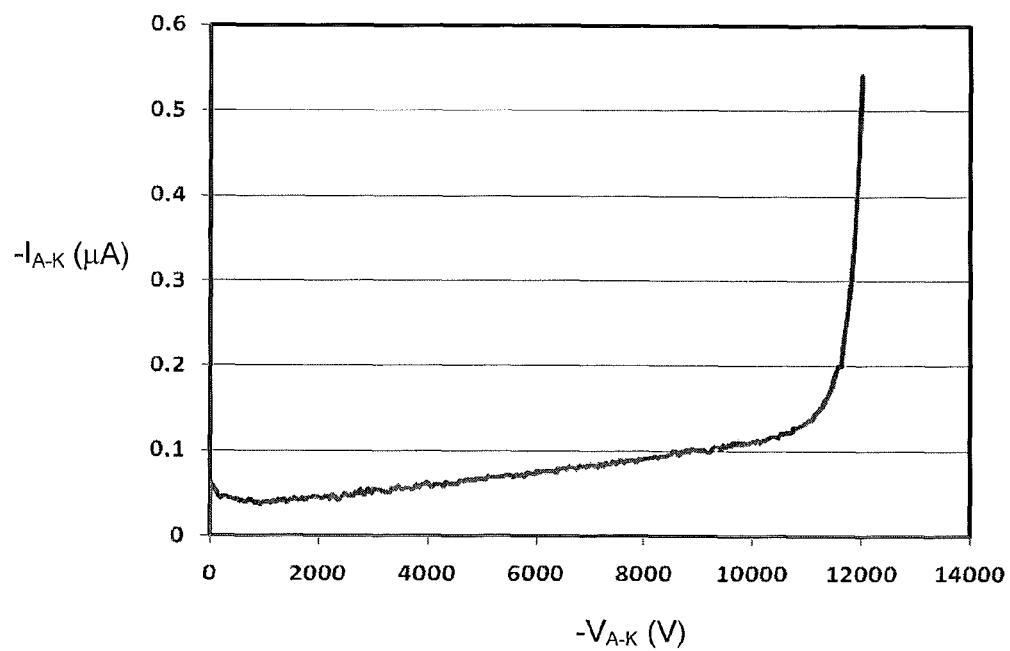
FIG. 5 is a graph illustrating blocking characteristics of a silicon carbide thyristor including an optically triggered assistant thyristor in accordance with some embodiments.

FIG. 5 is a graph illustrating blocking characteristics of a silicon carbide thyristor including an optically triggered assistant thyristor in accordance with some embodiments. In particular, FIG. 5 illustrates that a thyristor according to some embodiments may have a reverse blocking voltage in excess of 12 kV.

Silicon carbide thyristors having a device area greater than 1 cm$^2$ according to some embodiments may be capable of blocking voltages in excess of 10 kV. Silicon carbide devices according to some embodiments may have blocking voltages in excess of 12 kV, and in some cases in excess of 15 kV. In particular, silicon carbide based thyristors according to some embodiments may employ optically triggered assistant thyristors that are formed integrally to the transistor.

Moreover, a silicon carbide thyristor according to some embodiments may include a resistive buffer layer 14 between the substrate 12 and the drift layer 18 that also forms a p-n junction and functions as a carrier injection layer. In particular, the resistive buffer layer 14 may have a conductivity type that is the same as the substrate but may be doped at a lower doping concentration so that the layer is more resistive. The resistive buffer layer 14 may further form a p-n junction with a second buffer layer 16 that has the same conductivity type as the drift layer 18 but that is doped more highly than the drift layer 18.

By including such a resistive buffer layer 14, the minority injection coefficient may be reduced at high temperature, which may cause the device to have a positive temperature coefficient of the forward voltage drop at a lower temperature. In contrast, U.S. Pat. No. 5,831,287, which is incorporated herein by reference, uses a purely resistive extra-layer to achieve a positive temperature coefficient, but does not achieve this by reducing minority carrier injection. As discussed herein, according to some embodiments, a positive temperature coefficient can also be achieved by adjusting (reducing) the minority injection coefficient at high temperature. This can be accomplished by inclusion of a relatively thick and moderately doped buffer layer 14.

Figure 6:
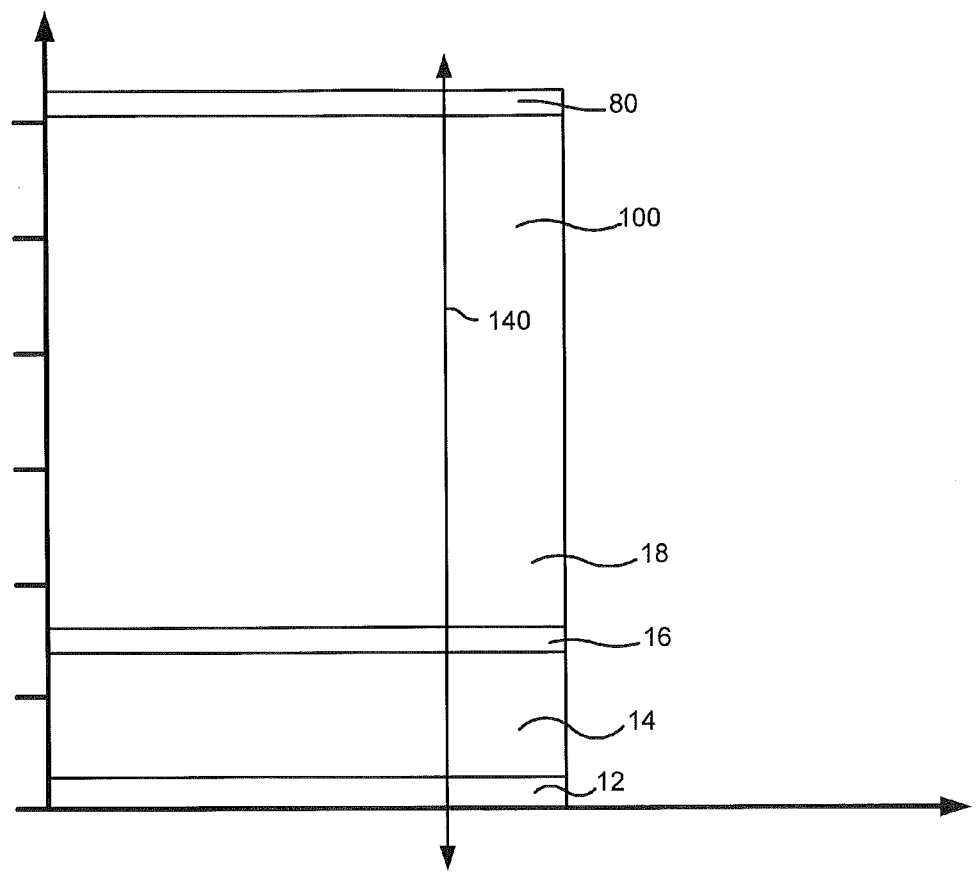
FIG. 6 is a schematic diagram of a hypothetical test structure that was simulated to illustrate the reduction in minority carrier injection in a device according to some embodiments.

FIG. 6 is a schematic diagram of a hypothetical test structure 100 that was simulated to illustrate the reduction in minority carrier injection that results from the inclusion of the resistive buffer layer 14. As shown therein, the test structure 100 is a PIN diode structure that includes a substrate 12, a first n-type buffer layer 14, a second p-type buffer layer 16, a p-type drift layer 18 and a p-type contact layer 80. The first n-type buffer layer 14 is 23 microns thick with a doping concentration of 1E17 cm$^{-3}$. The second p-type buffer layer 16 is 2 microns thick with a doping concentration of 5E17 cm$^{-3}$. The drift layer 18 is 90 microns thick with a doping concentration of 2E14 cm$^{-3}$, and the p-type layer 80 is 2 microns thick with a doping concentration of 8E18 cm$^{-3}$.

Figure 7:
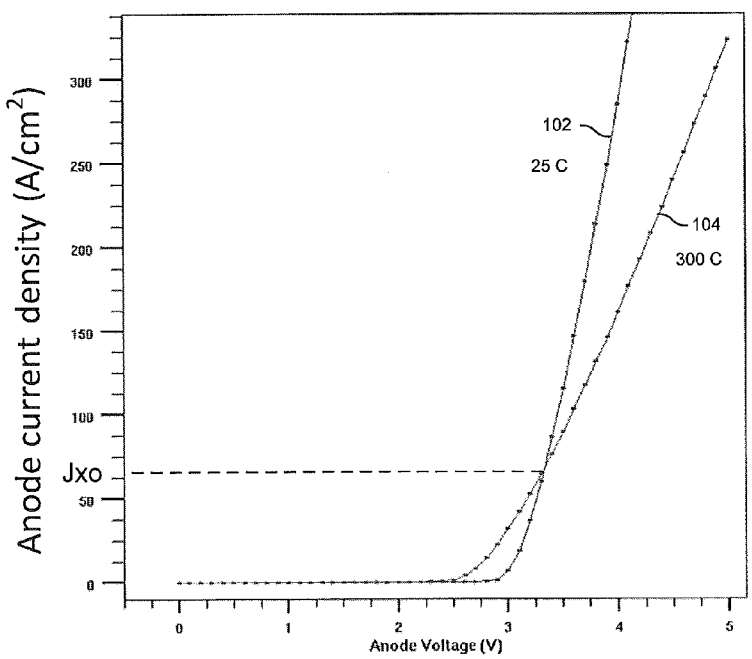
FIG. 7 is a graph that illustrates simulated anode current density versus anode voltage at a low temperature of 25° C. and a high temperature of 300° C.

Anode current density versus anode voltage was simulated at a low temperature of 25° C. and a high temperature of 300° C. The results are shown in FIG. 7 as curves 102 (25° C.) and 104 (300° C.). The cross-over point Jxo, which represents the current density at which the device transitions from a negative temperature coefficient of forward voltage to a positive temperature coefficient of forward voltage, is less than 100 A/cm$^2$. In particular, the cross-over point Jxo may be less than about 75 A/cm$^2$, and may be between about 50 and 75 A/cm$^2$.

Figure 8:
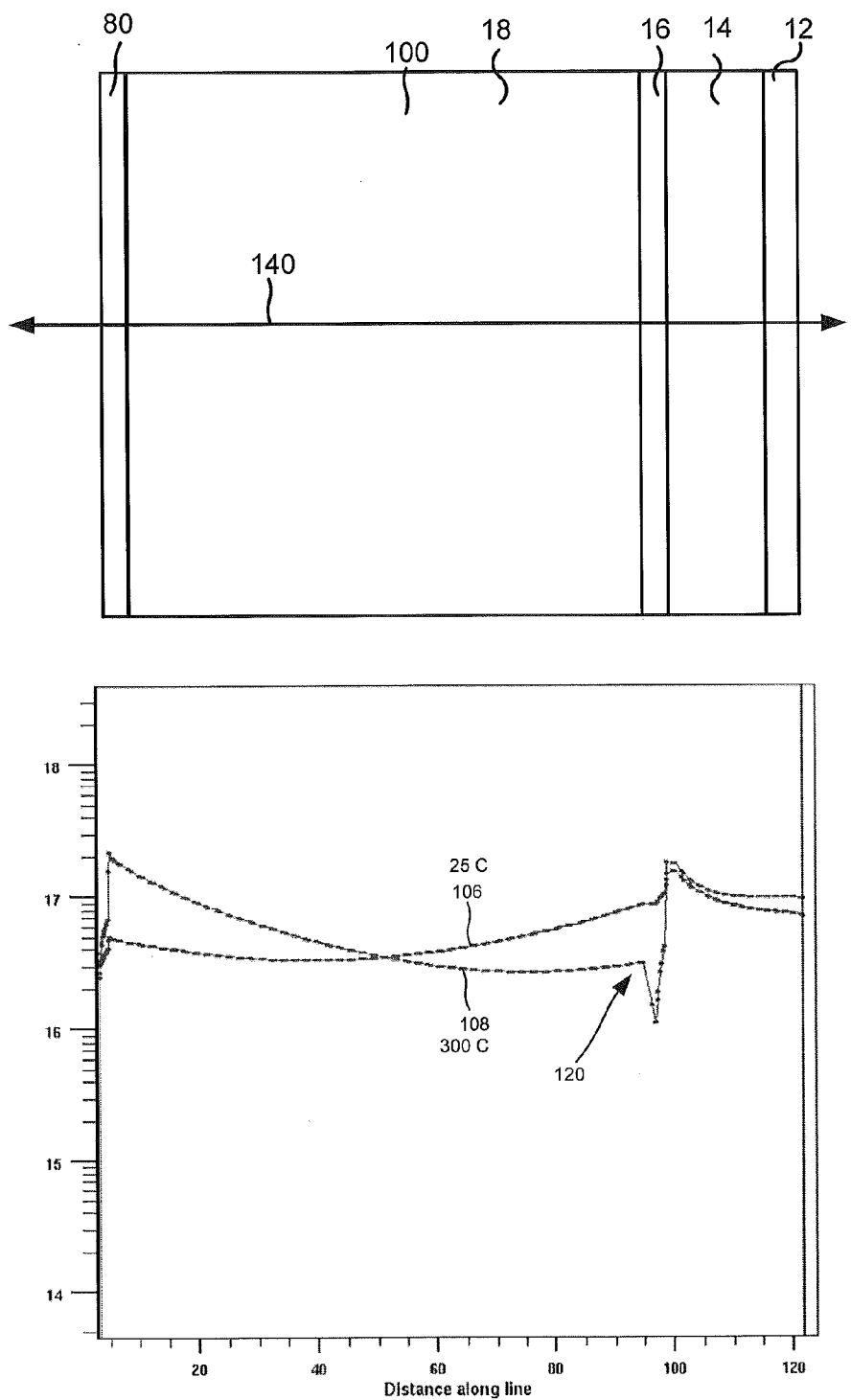
FIG. 8 is a graph that illustrates simulated minority carrier concentration at a low temperature of 25° C. and a high temperature of 300° C.

Minority carrier injection in the test structure 100 was also simulated. The results of this simulation are shown in FIG. 8, which is a graph of minority carrier concentration at an anode voltage of 5 V as a function of position in the device for low temperature operation (curve 106) and high temperature operation (curve 108) taken along the cutline 140 shown in FIG. 6. The test structure 100 is shown above the graph for reference.

As shown in FIG. 8, the minority carrier (electron) concentration in the drift layer of the device near the substrate is significantly reduced at the elevated temperature.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A thyristor, comprising:
    a semiconductor layer having a first conductivity type and a first doping concentration;
    a carrier injection layer on the semiconductor layer, the carrier injection layer having the first conductivity type and a second doping concentration that is lower than the first doping concentration, wherein the carrier injection layer has a thickness greater than 1 micron;
    a drift layer on the carrier injection layer, the drift layer having the second conductivity type;
    a buffer layer having the second conductivity type between the carrier injection layer and the drift layer, wherein the carrier injection layer and the buffer layer form a p-n junction;
    a base layer having the first conductivity type on the drift layer; and
    an anode region having the second conductivity type on the base layer, wherein the carrier injection layer is thicker than the buffer layer.

2. A thyristor, comprising:
a semiconductor layer having a first conductivity type and a first doping concentration;
a carrier injection layer on the semiconductor layer, the carrier injection layer having the first conductivity type and a second doping concentration that is lower than the first doping concentration, wherein the carrier injection layer has a thickness greater than 1 micron;
a drift layer on the carrier injection layer, the drift layer having the second conductivity type;
a base layer having the first conductivity type on the drift layer; and
an anode region having the second conductivity type on the base layer,
wherein a thickness of the carrier injection layer and the second doping concentration are selected to reduce minority carrier injection by the carrier injection layer in response to an increase in operating temperature of the thyristor.

3. The thyristor of claim 1, wherein a thickness of the carrier injection layer and the second doping concentration of the carrier injection layer are selected so that a cross-over current density at which the thyristor shifts from a negative temperature coefficient of forward voltage to a positive temperature coefficient of forward voltage is less than $100 \text{ A/cm}^2$.

4. The thyristor of claim 3, wherein thickness of the carrier injection layer and the second doping concentration of the carrier injection layer are selected so that a the cross-over current density at which the thyristor shifts from a negative temperature coefficient of forward voltage to a positive temperature coefficient of forward voltage is less than $75 \text{ A/cm}^2$.

5. The thyristor of claim 3, wherein thickness of the carrier injection layer and the second doping concentration of the carrier injection layer are selected so that a the cross-over current density at which the thyristor shifts from a negative temperature coefficient of forward voltage to a positive temperature coefficient of forward voltage is between $50 \text{ A/cm}^2$ and $75 \text{ A/cm}^2$.

6. The thyristor of claim 1, wherein the buffer layer has a third doping concentration that is higher than a doping concentration of the drift layer and that is lower than the second doping concentration of the carrier injection layer.

7. The thyristor of claim 1, wherein the base layer comprises a main base layer and an assistant base layer that is isolated from the main base layer by a trench, the thyristor further comprising an assistant anode region on the assistant base layer and having the second conductivity type, and a conductive interconnect between the assistant anode region and the main base layer.

8. The thyristor of claim 1, wherein the assistant base layer defines an optically triggered driver thyristor, and wherein the base layer comprises a main base layer and an assistant base layer that is isolated from the main base layer, the thyristor further comprising an assistant anode region on the assistant base layer and having the second conductivity type, and a conductive interconnect between the assistant anode region and the main base layer, the thyristor also including one or more doped regions that extend into the drift layer in a region of the thyristor between the main base layer and the assistant base layer that are more heavily doped than the drift layer and that are configured to provide field protection in reverse blocking mode operation of the thyristor.

9. The thyristor of claim 1, wherein the semiconductor layer comprises a semiconductor substrate, and wherein the semiconductor substrate, the carrier injection layer, the buffer layer, the drift layer, the base layer and the anode region comprise silicon carbide, and wherein the base layer further comprises first and second regions, where the second region has a doping concentration that is greater than a doping concentration of the first region.

10. A thyristor, comprising:
a semiconductor layer having a first conductivity type;
a carrier injection layer on top of the semiconductor layer, the carrier injection layer having the first conductivity type;
a drift layer on top of the carrier injection layer, the drift layer having the second conductivity type;
a base layer having the first conductivity type on the drift layer;
an anode region having the second conductivity type on the base layer; and
wherein the carrier injection layer has a resistance that is sufficient to reduce minority carrier injection by the carrier injection layer in response to an increase in operating temperature of the thyristor,
wherein a doping concentration of the carrier injection layer is at least an order of magnitude less than a doping concentration of the semiconductor layer.

11. The thyristor of claim 10, wherein a thickness of the carrier injection layer and the second doping concentration of the carrier injection layer are selected so that a cross-over current density at which the thyristor shifts from a negative temperature coefficient of forward voltage to a positive temperature coefficient of forward voltage is less than $100 \text{ A/cm}^2$.

12. The thyristor of claim 11, wherein the a thickness of the carrier injection layer and the second doping concentration of the carrier injection layer are selected so that a cross-over current density at which the thyristor shifts from a negative temperature coefficient of forward voltage to a positive temperature coefficient of forward voltage is less than $75 \text{ A/cm}^2$.

13. The thyristor of claim 11, wherein the a thickness of the carrier injection layer and the second doping concentration of the carrier injection layer are selected so that a cross-over current density at which the thyristor shifts from a negative temperature coefficient of forward voltage to a positive, temperature coefficient of forward voltage is between $50 \text{ A/cm}^2$ and $75 \text{ A/cm}^2$.

14. The thyristor of claim 10, further comprising a buffer layer having the second conductivity type between the carrier injection layer and the drift layer, wherein the carrier injection layer and the buffer layer form a p-n junction, wherein the carrier injection layer is thicker than the buffer layer.

15. The thyristor of claim 14, wherein the buffer layer has a third doping concentration that is higher than a doping concentration of the drift layer and that is lower than the second doping concentration of the carrier injection layer.

16. The thyristor of claim 15, wherein the second doping concentration of the carrier injection layer is at least five times greater than the third doping concentration of the buffer layer.

17. The thyristor of claim 10, wherein the base layer comprises a main base layer and an assistant base layer that is isolated from the main base layer by a trench, the thyristor also including one or more doped regions that extend into the drift layer below the trench that are more heavily doped than the drift layer by at least two orders of magnitude and that are configured to provide field protection in reverse blocking mode operation of the thyristor.

18. The thyristor of claim 10, wherein the doping concentration of the carrier injection layer is between $5 \times 10^{17} \text{ cm}^{-3}$ and $5 \times 10^{18} \text{ cm}^{-3}$ and the doping concentration of the semiconductor layer is between $5 \times 10^{17} \text{ cm}^{-3}$ and $5 \times 10^{18} \text{ cm}^{-3}$.

19. The thyristor of claim 6, wherein the second doping concentration of the carrier injection layer is at least five times greater than the third doping concentration of the buffer layer.

* * * * *

UNITED STATES PATENT AND TRADEMARK OFFICE
CERTIFICATE OF CORRECTION

PATENT NO.         : 9,171,977 B2                                   Page 1 of 1
APPLICATION NO.    : 13/461049
DATED              : October 27, 2015
INVENTOR(S)        : Zhang It is certified that error appears in the above-identified patent and that said Letters Patent is hereby corrected as shown below:

In the Specification:
Column 3, Line 6: Please correct "a silicon" to read -- A silicon --

In the Claims:
Column 11, Claim 4, Line 30: Please correct "so that a the cross-over"
                             to read -- so that the cross-over --
Column 11, Claim 5, Line 36: Please correct "so that a the cross-over"
                             to read -- so that the cross-over --
Column 12, Claim 12, Line 31: Please correct "wherein the a thickness"
                              to read -- wherein the thickness --
Column 12, Claim 13, Line 37: Please correct "wherein the a thickness"
                              to read -- wherein the thickness --
Column 12, Claim 13, Line 41: Please correct "positive,"
                              to read -- positive --

Signed and Sealed this
Fifth Day of July, 2016

Michelle K. Lee
*Director of the United States Patent and Trademark Office*